United States Patent [19]

Kohr et al.

[11] Patent Number: 5,663,542
[45] Date of Patent: Sep. 2, 1997

[54] CONTACT DEVICE FOR RAIN SENSOR OF A VEHICLE

[75] Inventors: Rainer Kohr, Oberbillig; Dieter Busch, Rosbach, both of Germany

[73] Assignee: VDO Adolf Schindling AG, Frankfurt, Germany

[21] Appl. No.: 498,239

[22] Filed: Jul. 5, 1995

[30] Foreign Application Priority Data

Jul. 7, 1994 [DE] Germany .............. 44 23 888.6

[51] Int. Cl.⁶ .............. H01H 29/00; G01R 27/14
[52] U.S. Cl. .............................................. 200/61.05
[58] Field of Search .................. 200/61.04, 61.06; 219/501, 519; 324/691–724

[56] References Cited

U.S. PATENT DOCUMENTS

| | | | |
|---|---|---|---|
| 4,127,763 | 11/1978 | Roselli | 200/61.05 X |
| 4,277,742 | 7/1981 | Kovac et al. | 219/501 X |
| 4,297,565 | 10/1981 | Parr | 219/522 |
| 4,805,070 | 2/1989 | Koontz et al. | 361/286 |
| 4,831,493 | 5/1989 | Wilson et al. | 361/286 |
| 5,416,622 | 5/1995 | Engfer et al. | 359/88 |

FOREIGN PATENT DOCUMENTS 8512616  12/1985  Germany .............. B60S 1/08

*Primary Examiner*—J. R. Scott
*Attorney, Agent, or Firm*—Martin A. Farber

[57] ABSTRACT

A device for the electric contacting of a sensor present on the outer side of the window of a motor vehicle, which sensor has an electric conductive track which is connected to an electric connecting contact within the motor vehicles. In order to produce a device for the corrosion-free, water-tight electric contacting of a moisture sensor present on the outer side of the motor vehicle, a conductive track arranged on a flexible support is arranged on the vehicle window, gripping around its edge region, the conductive track being conductively connected to the sensor conductive track in the region outside the vehicle and to a connecting contact in the region inside the vehicle.

14 Claims, 3 Drawing Sheets

CONTACT DEVICE FOR RAIN SENSOR OF A VEHICLE

FIELD AND BACKGROUND OF THE INVENTION

The present invention relates to a device for the electric contacting of a sensor present on the outer side of the window of a motor vehicle, the sensor having an electric conductive track which is connected to an electric connecting contact within the motor vehicle.

It is known to arrange wetness sensors on the windshield of a motor vehicle within the region of the windshield wipers. The wetness sensors provide, as a function of the degree of wetness present on the windshield, an electric signal to an evaluation circuit within the motor vehicle.

These signals are ordinarily used to control the windshield wiper.

In the case of sensors which are present on the outer side of the windshield, the conductive tracks, which are advantageously developed as structures which are interlaced in each other, are short-circuited by the drops of water, which short circuiting, depending on the degree of wetness, leads to different resistances and thus to different electric signals.

These sensors have the disadvantage that the conductive tracks of the moisture sensor outside the motor vehicle must be connected to the electric terminals inside the vehicle. In this connection, problems of corrosion and tightness arise which may lead to the impairing or failure of the results of the measurement.

SUMMARY OF THE INVENTION

The object of the invention is thus to provide a device for the corrosion-free, water-tight electric contacting of a moisture sensor which is present on the outside of the motor vehicle.

In accordance with the invention, this object is achieved by means of a conductive track which is arranged on a flexible support is arranged on the vehicle window surrounding the edge region thereof from the outside to the inside. The conductive track is conductively connected to the sensor conductive track in the region outside the vehicle and to a connecting contact in the region inside the vehicle.

The advantage of the invention resides in the compact development of the contact. The contact unit shields the electric contacts, in particular the electric conductive tracks, against any external influences, and particularly against moisture. The flexible development of the contacting device permits a form-locked adaptation to sensor and vehicle window. The direct electric contact between sensor conductive track and contact conductive track is reduced to the minimum necessary for operability.

The flexible support is advantageously fastened to the vehicle window by a layer of a heat-setting adhesive. The layer of heat-setting adhesive assures in this connection the sealing of the electric contacts and guarantees a firm attachment to the window of the vehicle.

In one embodiment, support, conductive track, and layer of heat-setting adhesive are arranged in form-locked manner bent around the edge of the vehicle window, the layer of heat-setting adhesive facing the window.

In a further development, the flexible support consists of a thermoplastic material which permits better mounting of the contact unit, particularly in heated state. Within and/or on the thermoplastic support, a metal strip is arranged in order to stabilize the contact unit.

The contact conductive track is connected to the sensor conductive track by means of a conductive adhesive.

For the better fastening of the conductive adhesive, a contact point is provided between conductive adhesive and conductive track of the contact unit.

The contact point is particularly resistant to corrosion if it consists of carbon.

In one development, the conductive track of the contact unit is printed on a flexible foil. In this case, the contact point outside the vehicle and the electric connection within the vehicle are arranged at opposite ends of the conductive track.

BRIEF DESCRIPTION OF THE DRAWINGS

With the above and other objects and other advantages in view, the present invention will become more clearly understood in connection with the detailed description of a preferred embodiment, when considered with the accompanying drawings of which.

DETAILED DESCRIPTION OF THE PREFERRED EMBODIMENT

Figure 1:
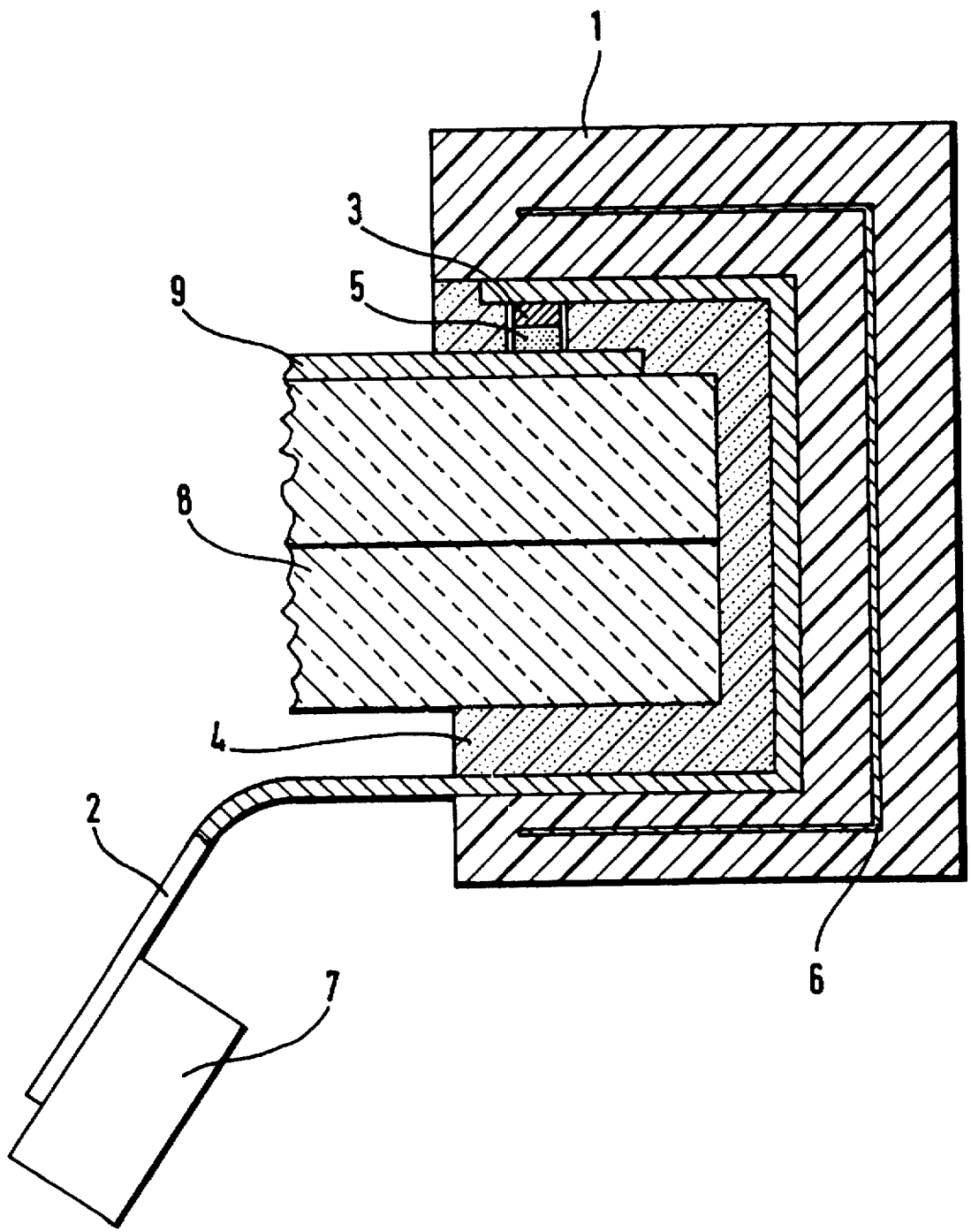
FIG. 1 shows a first contact unit in accordance with the invention.

FIG. 1 shows diagrammatically the contacting of a sensor, represented by its sensor conductive track 9, which is arranged on the window 8 of a motor vehicle within the region of the windshield wiper. The sensor conductive track 9 consists in this case preferably of chromium and chromium nitride. It has the thickness of a few atomic layers and has been applied by the thin-film process. The contact unit consists of a thermoplastic support 1 in which a metal insert 6 is contained for mechanical stabilization. On the support 1 there is a conductive track 2 which is printed on a flexible foil. This conductive track 2 has, opposite the sensor conductive track 9, a carbon contact point 3 which is separated from of the sensor conductive track 9 by a conductive adhesive 5 and serves for the better fastening of the conductive adhesive. The conductive track 2 thus connects the sensor conductive track 9, via the carbon contact point 3 and the conductive adhesive 5, electrically to a plug 7 attached by crimping which is present within the vehicle and which produces the connection with a signal-evaluation unit, not shown. The plug is mounted directly on the contact unit.

On the support 1, and on the conductive track 2 printed on the flexible foil, for instance a "Kapton" foil, there is applied a layer of heat-setting adhesive 4 which is recessed around the contact point 3.

The contact unit described is bent in heated state in form-locked manner around the edge of the vehicle window 8 so as to produce a stable conductive connection between sensor conductive track 9, conductive adhesive 5, carbon contact point 3, conductive track 2, and plug 7.

Figure 2:
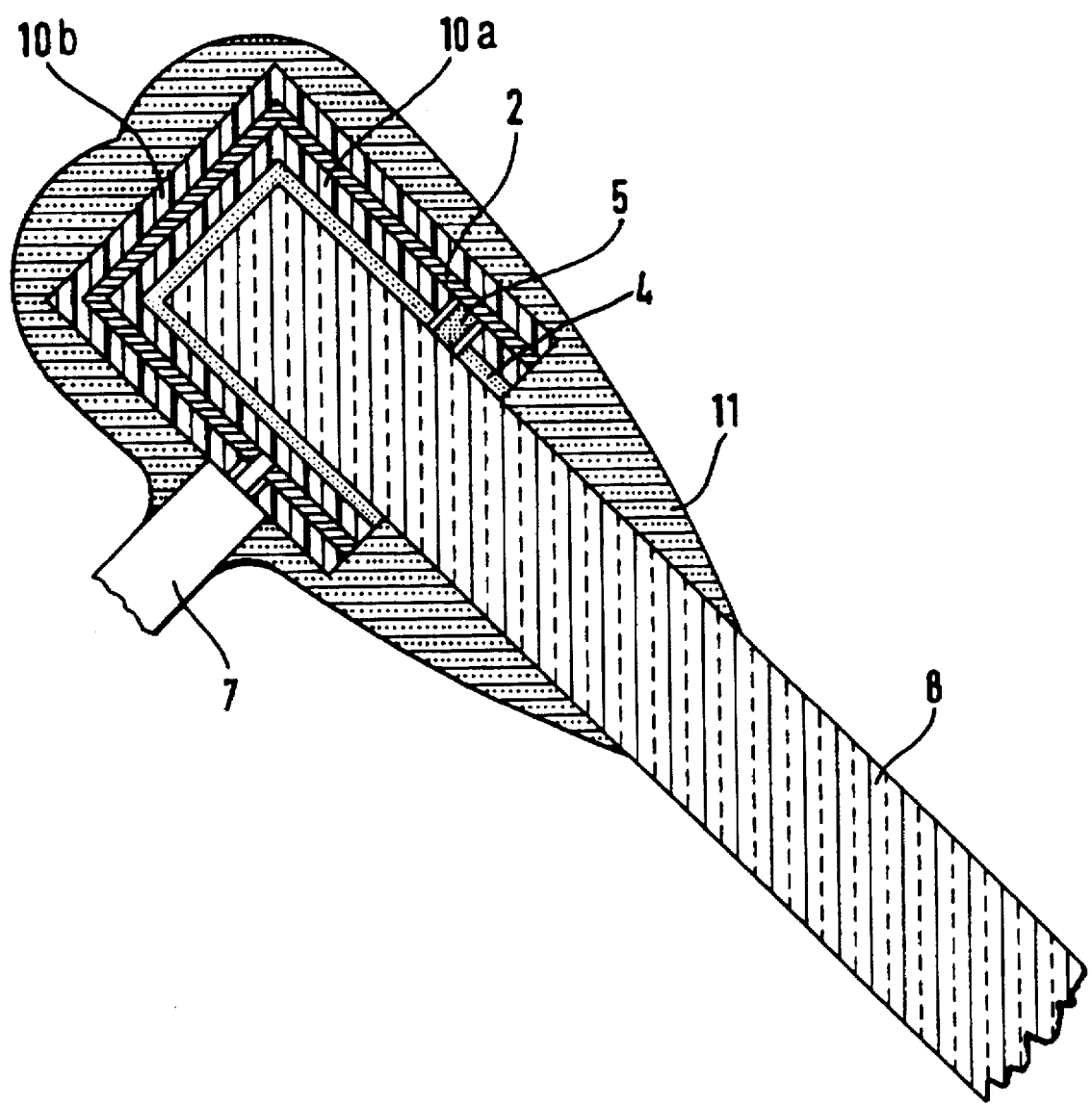
FIG. 2 shows a second contact unit in accordance with the invention.
Figure 3:
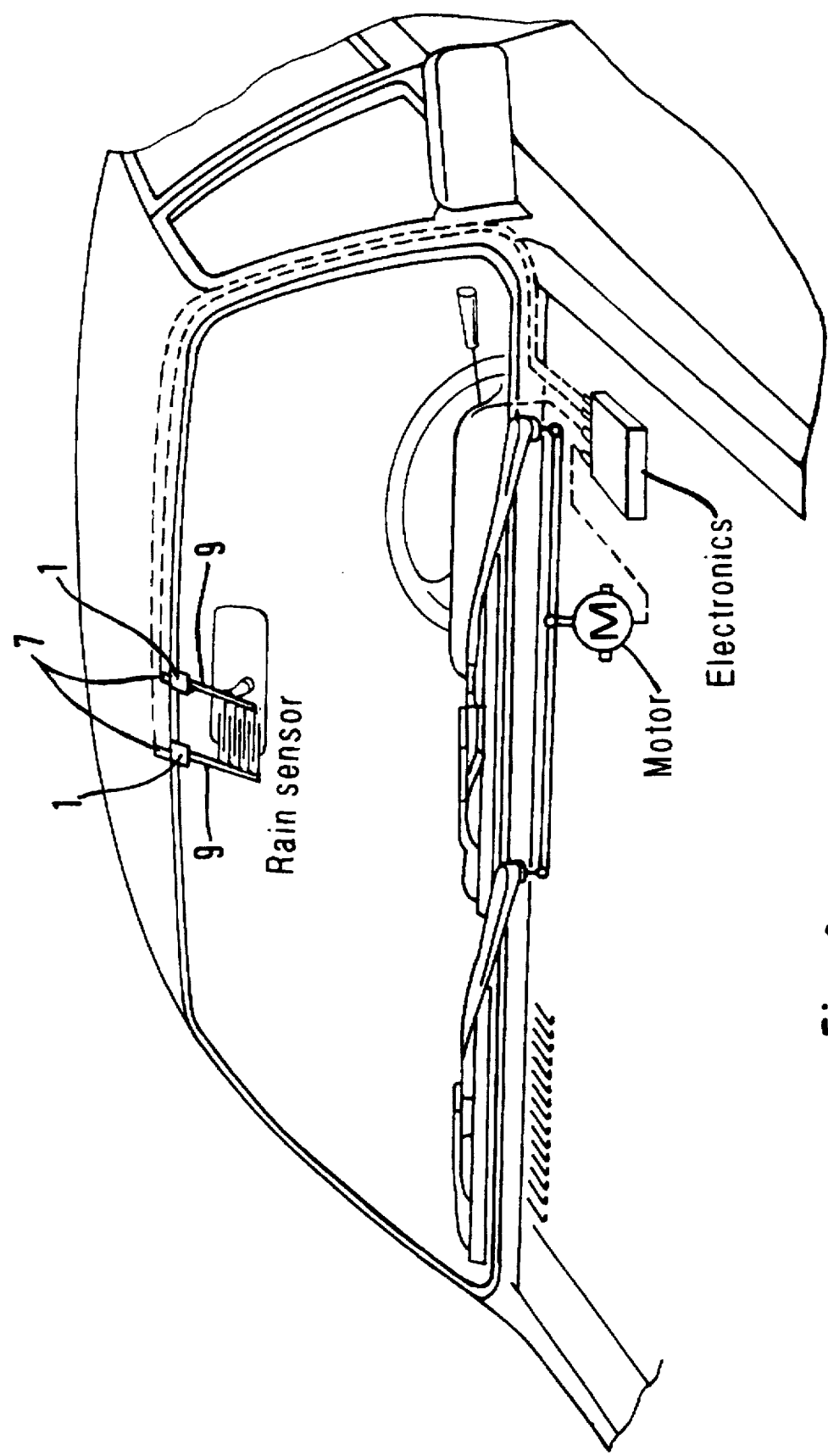
FIG. 3 is a stylized view of contact on windshield.

In accordance with FIG. 2, the sensor conductive track 9 (not shown) present on the vehicle window 8 is contacted, also via a conductive adhesive 5, with the copper conductive track 2 applied on a flexible foil 10b.

For the electric insulating of the copper conductive track 2 as well as for the stabilizing of the entire contact, a Kapton foil 10a is arranged above and below the copper foil 2.

The Kapton foil 10b which lies below the copper conductive track 2 has an interruption for producing an electric connection between sensor conductive track 9 and copper conductive track 2 via the conductive adhesive 5.

The same is true of the Kapton foil 10a arranged above the copper conductive track 2 for producing the electric contact between the copper conductive track 2 and the crimped-on plug 7 within the vehicle.

The entire contact formed in this manner is covered by a protective lacquer 11 in order to seal it off from moisture.

We claim:

1. A device for the electric contacting of a sensor present on the outer side of the window of a motor vehicle, the sensor having a first electric conductive track which is connected by the device to an electric connecting contact within the vehicle, the device comprising:

a second conductive track, and a flexible support which is arranged on the vehicle window gripping around an edge region of the window;

wherein the second conductive track is disposed on the support; and the second conductive track is conductively connected with the first conductive track in the region outside the vehicle and with the connecting contact in the region within the vehicle.

2. A device according to claim 1, further comprising a layer of heat-setting adhesive; and wherein the flexible support is fastened on the vehicle window by means of the layer of heat-setting adhesive.

3. A device according to claim 2, wherein the support, the second conductive track, and the layer of heat-setting adhesive are arranged bent in form-locked manner around the edge region of the vehicle window, the layer of heat-setting adhesive being on a side of the device facing the vehicle window.

4. A device according to claim 1, wherein the flexible support comprises a thermoplastic material.

5. A device according to claim 4, wherein the support further comprises a stabilizing metal strip.

6. A device according to claim 5, wherein the metal strip is disposed within the support.

7. A device according to claim 5, wherein the metal strip is disposed on the support.

8. A device according to claim 1, further comprising a conductive adhesive which serves to connect the second conductive track to the first conductive track.

9. A device according to claim 8, further comprising a conductive adhesive and a contact point;

wherein the contact point is arranged between the conductive adhesive and the second conductive track, the conductive adhesive joining the contact point with the first conductive track.

10. A device according to claim 9, wherein the contact point comprises carbon.

11. A device according to claim 1, further comprising a flexible foil; and wherein the second conductive track is printed on the flexible foil.

12. A device according to claim 10, wherein the contact point and the connecting contact within the vehicle are arranged on opposite ends of the second conductive track.

13. A device according to claim 1, wherein the first conductive track comprises a thin film conductive layer.

14. A device according to claim 13, wherein the first conductive track is a resistance track.

* * * * *